United States Patent
Gonzalez et al.

[11] Patent Number: 6,097,076
[45] Date of Patent: *Aug. 1, 2000

[54] SELF-ALIGNED ISOLATION TRENCH

[75] Inventors: Fernando Gonzalez; David Chapek; Randhir P. S. Thakur, all of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/823,609

[22] Filed: Mar. 25, 1997

[51] Int. Cl.$^7$ .................................................. H01L 29/00
[52] U.S. Cl. ...................... 257/513; 257/510; 257/524; 438/287; 438/424
[58] Field of Search .................................. 257/505, 508, 257/510, 513, 524; 438/287, 424

[56] References Cited

U.S. PATENT DOCUMENTS

| | | | |
|---|---|---|---|
| 3,791,882 | 2/1974 | Ogiue | 438/417 |
| 4,409,609 | 10/1983 | Fukuda | 257/520 |
| 4,717,682 | 1/1988 | Taka et al. | 438/361 |
| 4,819,052 | 4/1989 | Hutter | 257/378 |
| 4,965,221 | 10/1990 | Dennison et al. | 437/70 |
| 5,045,904 | 9/1991 | Kobayashi et al. | 257/304 |
| 5,221,857 | 6/1993 | Kano | 257/539 |
| 5,229,316 | 7/1993 | Lee et al. | 438/424 |
| 5,387,534 | 2/1995 | Prall | 438/287 |
| 5,433,794 | 7/1995 | Fazan et al. | 148/33.3 |
| 5,541,440 | 7/1996 | Kozai et al. | 257/513 |
| 5,780,325 | 7/1998 | Lee | 438/149 |

OTHER PUBLICATIONS

S. Wolf, "Silicon Processing for the VLSI Era, vol. 2 Process Integration," p. 331 Dec. 1990.

T. Ishijima et al., A Deep Sub–Micron Isolation Technology With T–Shaped Oxide (TSO) Structure, IEEE Publication No. Ch2865–4/90/0000–0257(1990), pp. 257–260.

S. Wolf, Silicon Processing for the VLSI Era, Vol. 2: Process Integration, Lalliee Press, pp. 54–56.

*Primary Examiner*—David Hardy
*Assistant Examiner*—Allan R. Wilson
*Attorney, Agent, or Firm*—Workman, Nydegger & Seeley

[57] ABSTRACT

The present invention relates to a method for forming an isolation trench structure in a semiconductor substrate without causing deleterious topographical depressions in the upper surface thereof which cause current and charge leakage to an adjacent active area. The inventive method forms a pad oxide upon a semiconductor substrate, and then forms a nitride layer on the pad oxide. The nitride layer is patterned with a mask and etched to expose a portion of the pad oxide layer and to protect an active area in the semiconductor substrate that remains covered with the nitride layer. A second dielectric layer is formed substantially conformably over the pad oxide layer and the remaining portions of the first dielectric layer. A spacer etch is then carried out to form a spacer from the second dielectric layer. The spacer is in contact with the remaining portion of the first dielectric layer. An isolation trench etch follows the spacer etch. An optional thermal oxidation of the surfaces in the isolation trench may be performed, which may optionally be followed by doping of the bottom of the isolation trench to further isolate neighboring active regions on either side of the isolation trench. A conformal layer is formed substantially conformably over the spacer, over the remaining portions of the first dielectric layer, and substantially filling the isolation trench. Planarization of the conformal layer follows, either by CMP or by etchback or by a combination thereof. An isolation trench filled with a structure results. The resulting structure has a flange and shaft, the cross section of which has a nail shape in cross section.

40 Claims, 9 Drawing Sheets

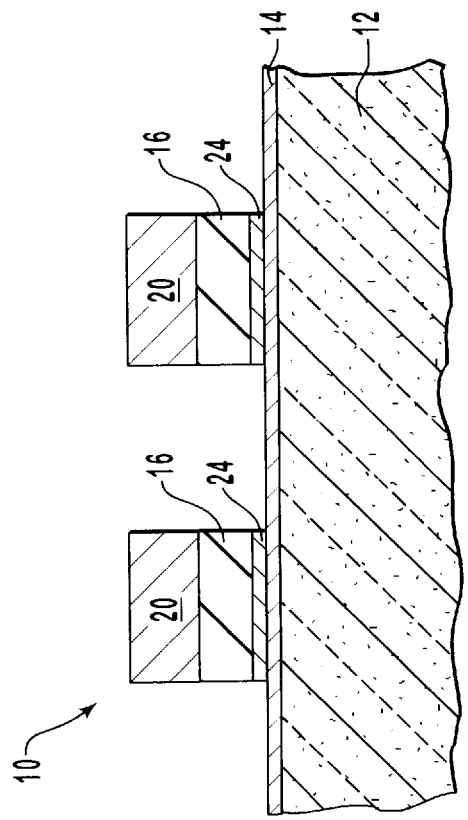
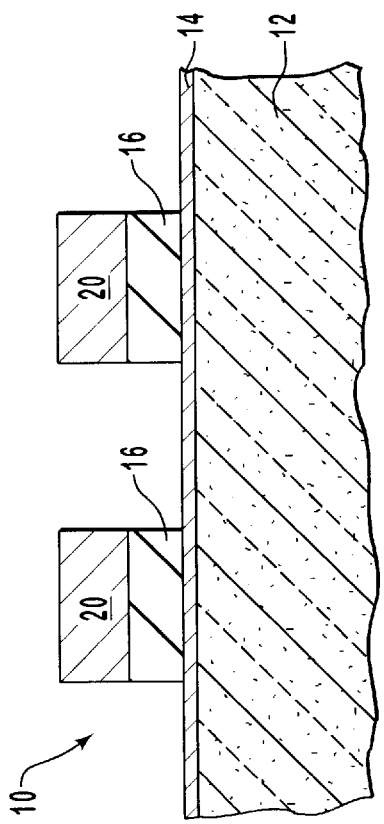

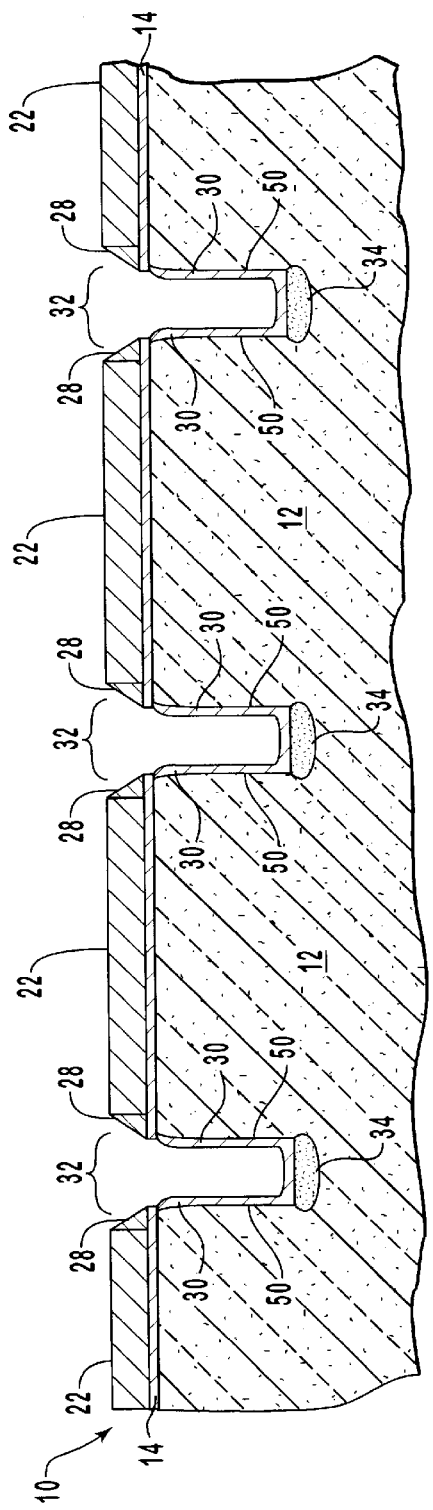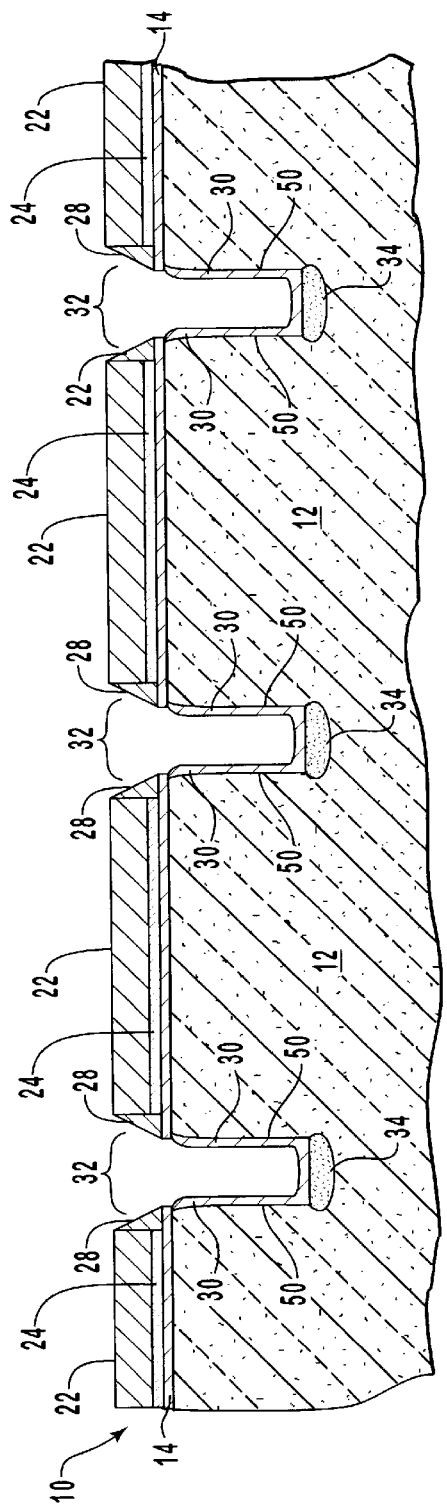

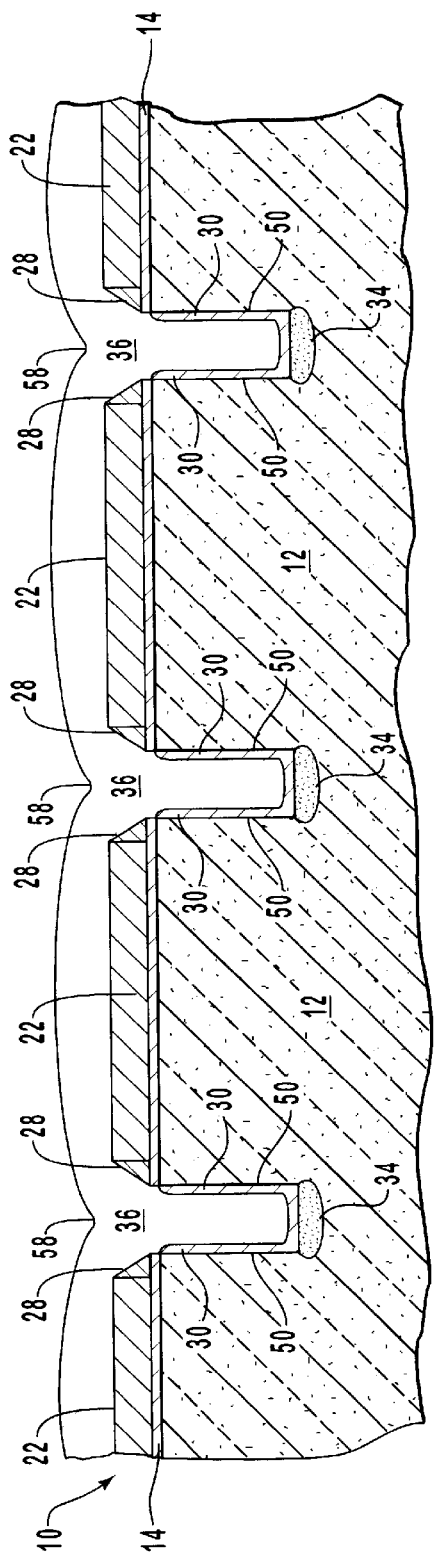
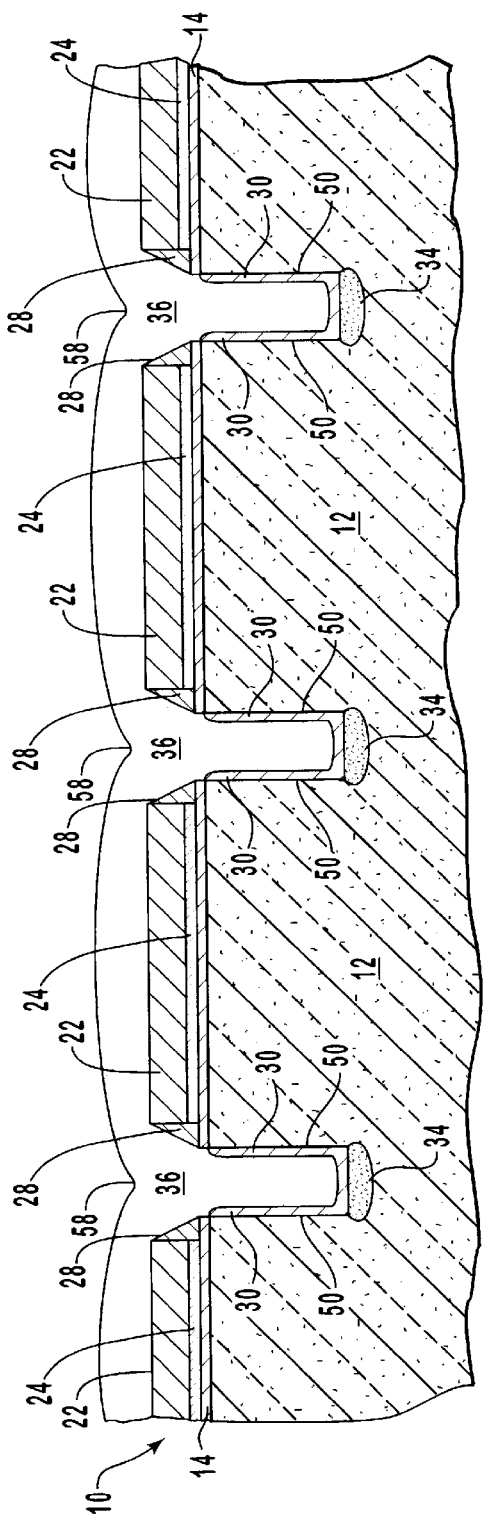
FIG. 6A
FIG. 6B

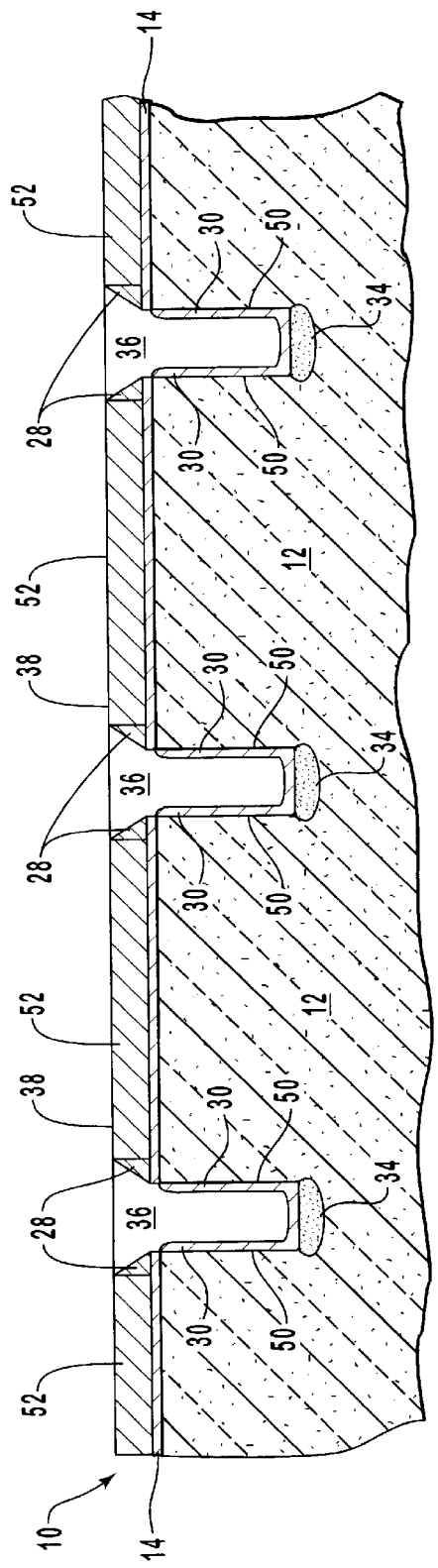
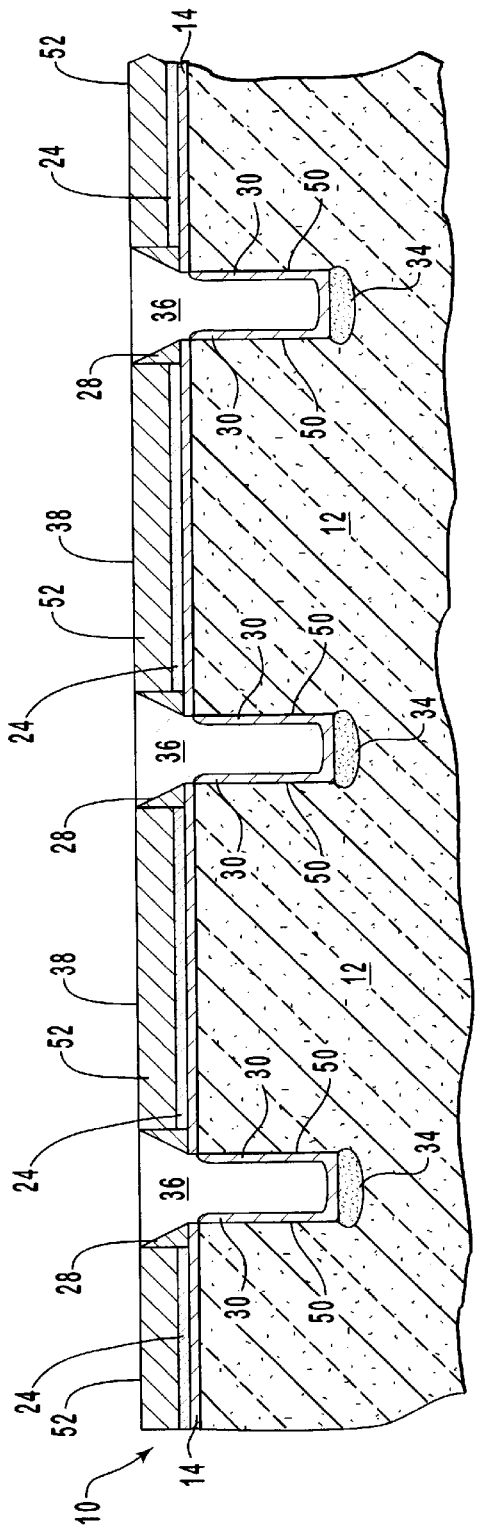
FIG. 7A
FIG. 7B

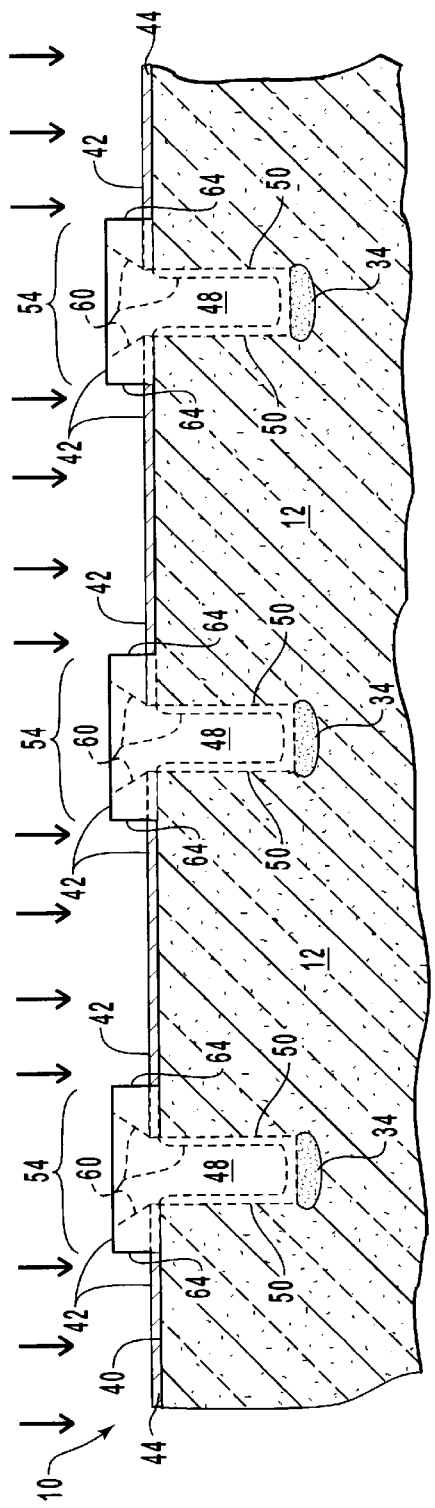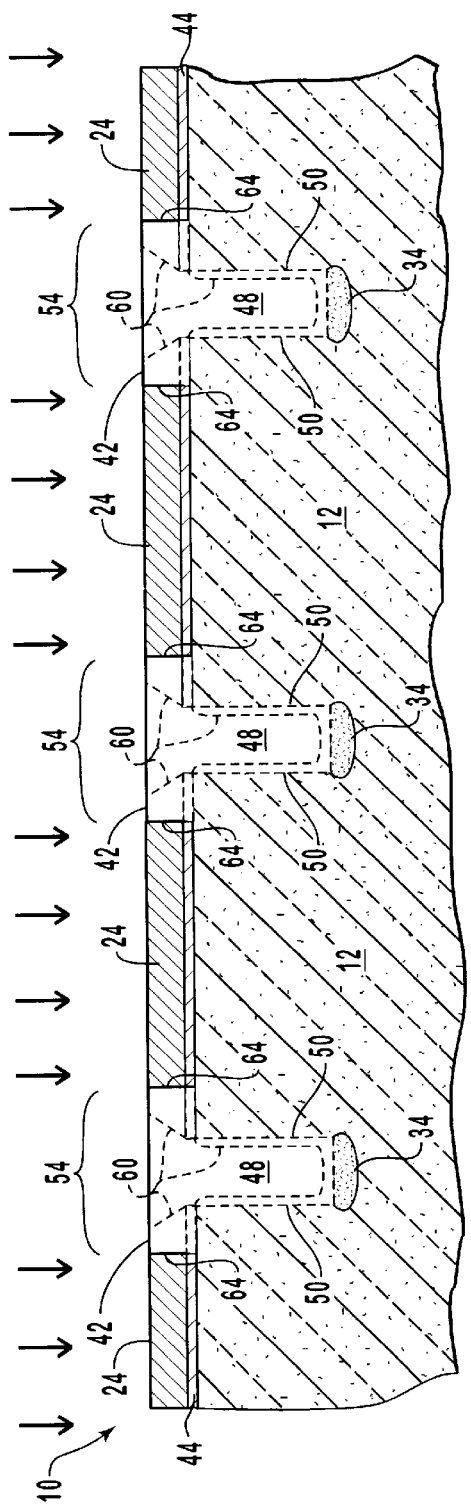

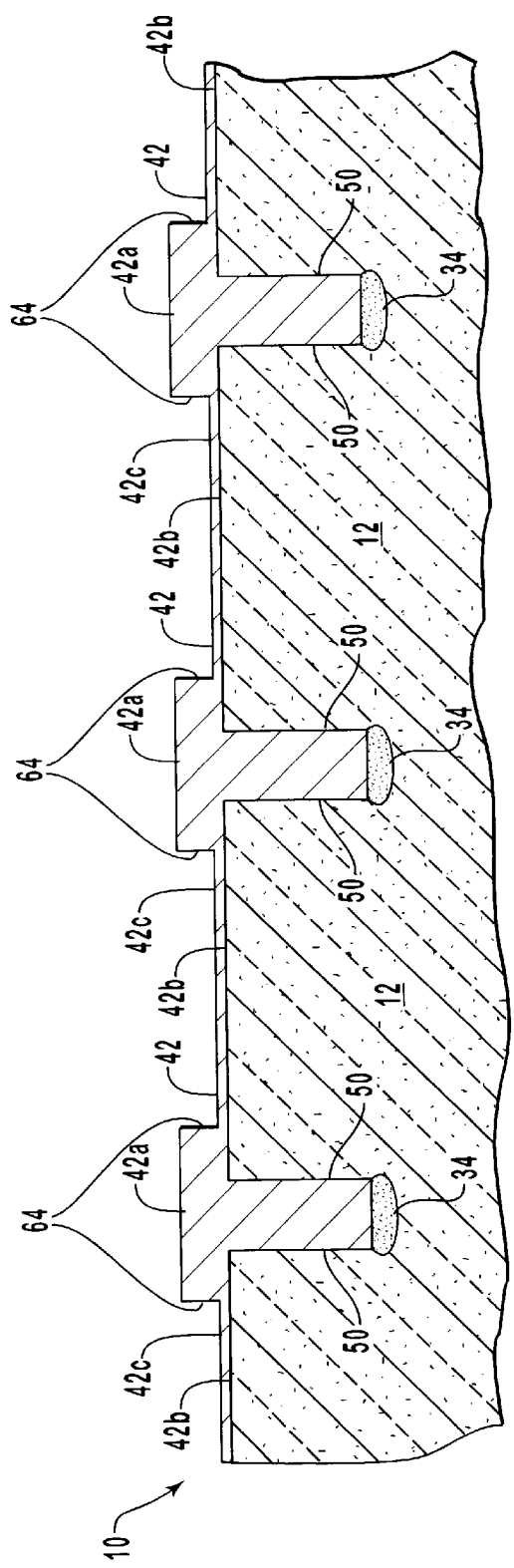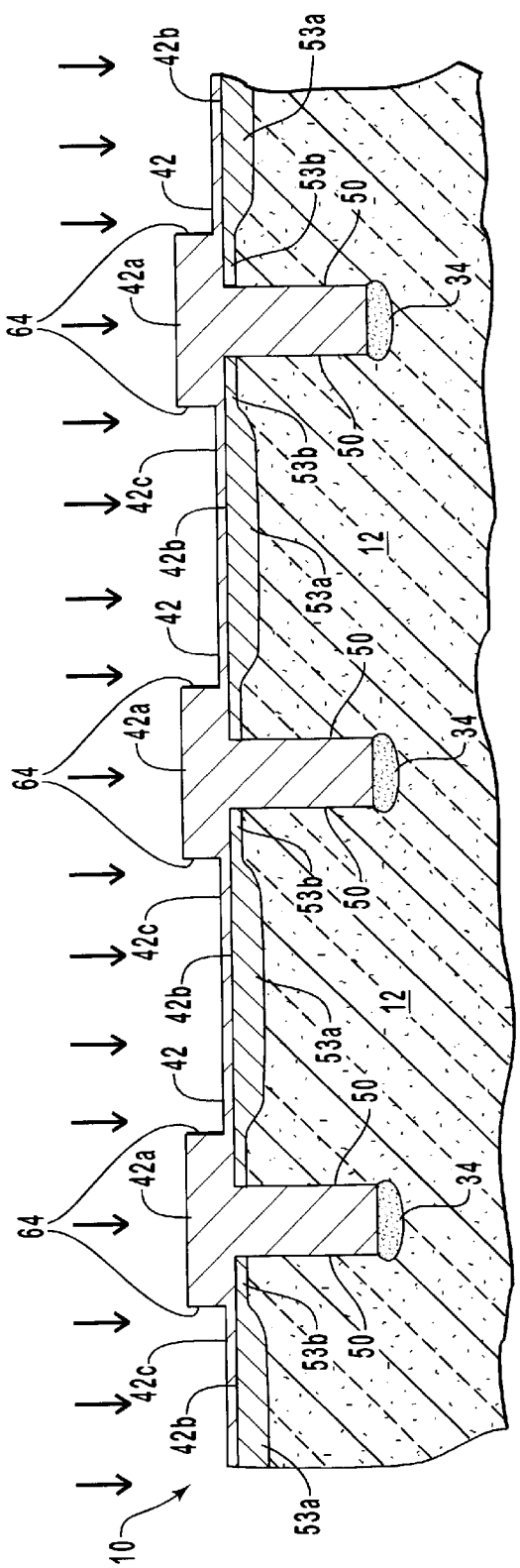
FIG. 9A
FIG. 9B

SELF-ALIGNED ISOLATION TRENCH

BACKGROUND OF THE INVENTION

1. The Field of the Invention

The present invention relates to forming an isolation trench in a semiconductor device. In particular, the present invention relates to a method of forming an isolation trench in an etching process for a semiconductor device that combines a spacer etch with a trench etch.

2. The Relevant Technology

An isolation trench is used in an active area associated with a microelectronic device on a semiconductor substrate or on a substrate assembly. Isolation trenches allow microelectronics devices to be placed increasingly closer to each other without causing detrimental electronic interaction such as unwanted capacitance build-up and cross-talk. In the context of this document, the term semiconductive substrate is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term substrate assembly is intended herein to mean a substrate having one or more layers or structures formed thereon. As such, the substrate assembly may be, by way of example and not by way of limitation, a doped silicon semiconductor substrate typical of a semiconductor wafer.

The ever-present pressure upon the microelectronics industry to shrink electronic devices and to crowd a higher number of electronic devices onto a single die, called miniaturization, has required the use of such structures as isolation trenches.

In the prior state of the art, an etching process of fill material within an isolation trench has been problematic. As seen in FIG. 1, a semiconductor substrate 12 has an isolation trench substantially filled up with an isolation material 48. A pad oxide 14 is situated on the active area of semiconductor substrate 12. Isolation material 48 exhibits a non-planarity at the top surface thereof between corners 62, particularly as is seen at reference numeral 46 in FIG. 1. The non-planarity of the top surface of isolation material 48 is due to dissimilarity of etch rates between isolation material 48 and pad oxide 14, particularly at corners 62 of the active area of semiconductor substrate 12.

An active area may be formed within semiconductor substrate 12 immediately beneath pad 14, and adjacent isolation material 48. A problem that is inherent in such non-planarity of fill material within an isolation trench is that corners 62 may leave the active area of semiconductor substrate 12 exposed. As such, isolation material 48 will not prevent layers formed thereon from contacting the active area of semiconductor substrate 12 at corners 62. Contact of this sort is detrimental in that it causes charge and current leakage. Isolation material 48 is also unable to prevent unwanted thermal oxide encroachment through corners 62 into the active area of semiconductor substrate 12.

What is needed is a method of forming an isolation trench, where subsequent etching of fill material within the isolation trench of such method prevents overlying layers from having contact with an adjacent active area, and prevents unwanted thermal oxide encroachment into the active area. What is also needed is a method of forming an isolation trench wherein etching or planarizing such as by chemical mechanical planarization (CMP) of isolation trench materials is accomplished without forming a recess at the intersection of the fill material in the isolation trench and the material of the active area within the semiconductor substrate.

SUMMARY OF THE INVENTION

The present invention relates to a method for forming an isolation trench structure on a semiconductor substrate. The inventive method forms and fills the isolation trench without causing deleterious topographical depressions in the upper surface of the fill material in the isolation trench, while substantially preventing contact between layers overlying the fill material of the isolation trench and the active area of the semiconductor substrate. By avoiding such deleterious topographical depressions and the exposure of the active area, detrimental charge and current leakage is minimized.

The inventive method of forming an isolation trench comprises forming a pad oxide upon a semiconductor substrate and depositing a first dielectric layer thereupon. By way of non-limiting example, the first dielectric layer is a nitride layer. The first dielectric layer is patterned and etched with a mask to expose a portion of the pad oxide layer and to protect an active area in the semiconductor substrate that remains covered with the first dielectric layer. A second dielectric layer is formed substantially conformably over the pad oxide layer and the remaining portions of the first dielectric layer.

A spacer etch is used to form a spacer from the second dielectric layer. The spacer electrically insulates the first dielectric layer. An isolation trench etch follows the spacer etch and creates within the semiconductor substrate an isolation trench that is defined by surfaces in the semiconductor substrate. The spacer formed by the spacer etch facilitates self-alignment of the isolation trench formed by the isolation trench etch. The isolation trench etch can be carried out with the same etch recipe as the spacer etch, or it can be carried out with an etch recipe that is selective to the spacer. Once the isolation trench is formed, an insulation liner on the inside surface of the isolation trench can be optionally formed, either by deposition or by thermal oxidation.

A third dielectric layer is formed substantially conformably over the spacer and the first dielectric layer so as to substantially fill the isolation trench. Topographical reduction of the third dielectric layer follows, preferably so as to planarize the third dielectric layer for example by chemical mechanical planarizing (CMP), by dry etchback, or by a combination thereof.

The topographical reduction of the third dielectric layer may also be carried out as a single etchback step that sequentially removes superficial portions of the third dielectric layer that extend out of the isolation trench. The single etchback also removes portions of the remaining spacer, and removes substantially all of the remaining portions of the first dielectric layer. Preferably, the single etchback will use an etch recipe that is more selective to the third dielectric layer and the spacer than to the remaining portions of the first dielectric layer. The single etchback uses an etch recipe having a selectivity that will preferably leave a raised portion of the third dielectric layer extending above the isolation trench while removing substantially all remaining portions of the first dielectric layer. The resulting structure can be described as having the shape of a nail as viewed in a direction that is substantially orthogonal to the cross section of a word line in association therewith.

Several other processing steps are optional in the inventive method. One such optional processing step is the deposition of a polysilicon layer upon the pad oxide layer to act as an etch stop or planarization marker. Another optional processing step includes clearing the spacer following the isolation trench etch. An additional optional processing step includes implanting doping ions at the bottom of the isolation trench to form a doped trench bottom. When a CMOS device is being fabricated, the ion implantation process may require a partial masking of the semiconductor substrate so as to properly dope selected portions of the semiconductor substrate.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 3A illustrates further processing of the structure depicted in FIG. 2A, wherein a mask has been patterned and the nitride layer has been etched down to the pad oxide layer to form a nitride island over future or current active areas in the substrate that are to be protected.

FIG. 3B illustrates further processing of the structure depicted in FIG. 2B, wherein a mask has been patterned and the nitride layer has been etched down through the nitride layer and the polysilicon layer to stop on the pad oxide layer, thereby forming a nitride island and a polysilicon island over future or current active areas in the substrate that are to be protected.

FIGS. 5A and 5B illustrate further processing of the structure depicted, respectively, in FIGS. 4A and 4B, in which the insulation film has been etched to form a spacer, a simultaneous or serial etch has formed an isolation trench, thermal oxidation or deposition within the isolation trench has formed an insulation liner therein, and wherein an optional ion implantation has formed a doped region at the bottom of the isolation trench.

FIGS. 6A and 6B illustrate further processing of the structure depicted, respectively, in FIGS. 5A and 5B, in which an isolation film has been deposited over the spacer, the isolation trench within the isolation trench liner, and the nitride island.

FIGS. 7A and 7B illustrate further processing of the structure depicted, respectively, in FIGS. 6A and 6B, wherein a planarization process has formed a first upper surface made up of the nitride island, the spacer, and the isolation film, all being substantially co-planar on the first upper surface.

FIG. 8A illustrates further processing of the structure depicted in FIGS. 7A or 9A, wherein the semiconductor substrate has been implanted with ions, and wherein the isolation film, optionally the pad oxide layer, the insulation liner, and the spacer have fused to form a unitary isolation structure.

FIG. 8B illustrates optional further processing of the structure depicted in FIG. 6B, wherein an etching process using an etch recipe that is slightly selective to oxide over nitride, has etched back the isolation film, the nitride island, and the spacer to expose the polysilicon island, and has formed a filled isolation trench which, when viewed in a direction that is substantially orthogonal to the cross section of the depicted word line, has the shape of a nail.

FIG. 9A illustrates optional further processing of the structure depicted in FIG. 6A or in FIG. 7A, wherein an etch-selective recipe that is slightly selective to oxide over nitride has formed a filled isolation trench which, when viewed in cross section, has the shape of a nail.

FIG. 9B illustrates further processing of the structure depicted in either FIGS. 7B or 8B wherein the semiconductor substrate has been implanted with ions, and wherein the isolation film, optionally the pad oxide layer, the insulation liner, and the spacer have been fused to form a filled isolation trench.

DETAILED DESCRIPTION OF THE PREFERRED EMBODIMENTS

The present invention relates to a method for forming a self-aligned isolation trench. The isolation trench is preferably a shallow trench isolation region that is self-aligned to an underlying active area. Stated otherwise, the inventive method forms a Narrow self-aligned Active area Isolation region that is inherently Level (NAIL). In the method of the present invention, a spacer etch and an isolation trench etch can be accomplished essentially within the same processing step.

Another aspect of the present invention relates to a combined nitride and oxide etch that is selective to polysilicon, and in which selectivity of the etch between nitride and oxide materials favors one or the other by a factor of about one half. A still further aspect of the present invention relates to the use of a polysilicon film as an etch stop or planarization marker film. The structure achieved by the method of the present invention achieves particular advantages that overcome problems of the prior art.

Figure 1:
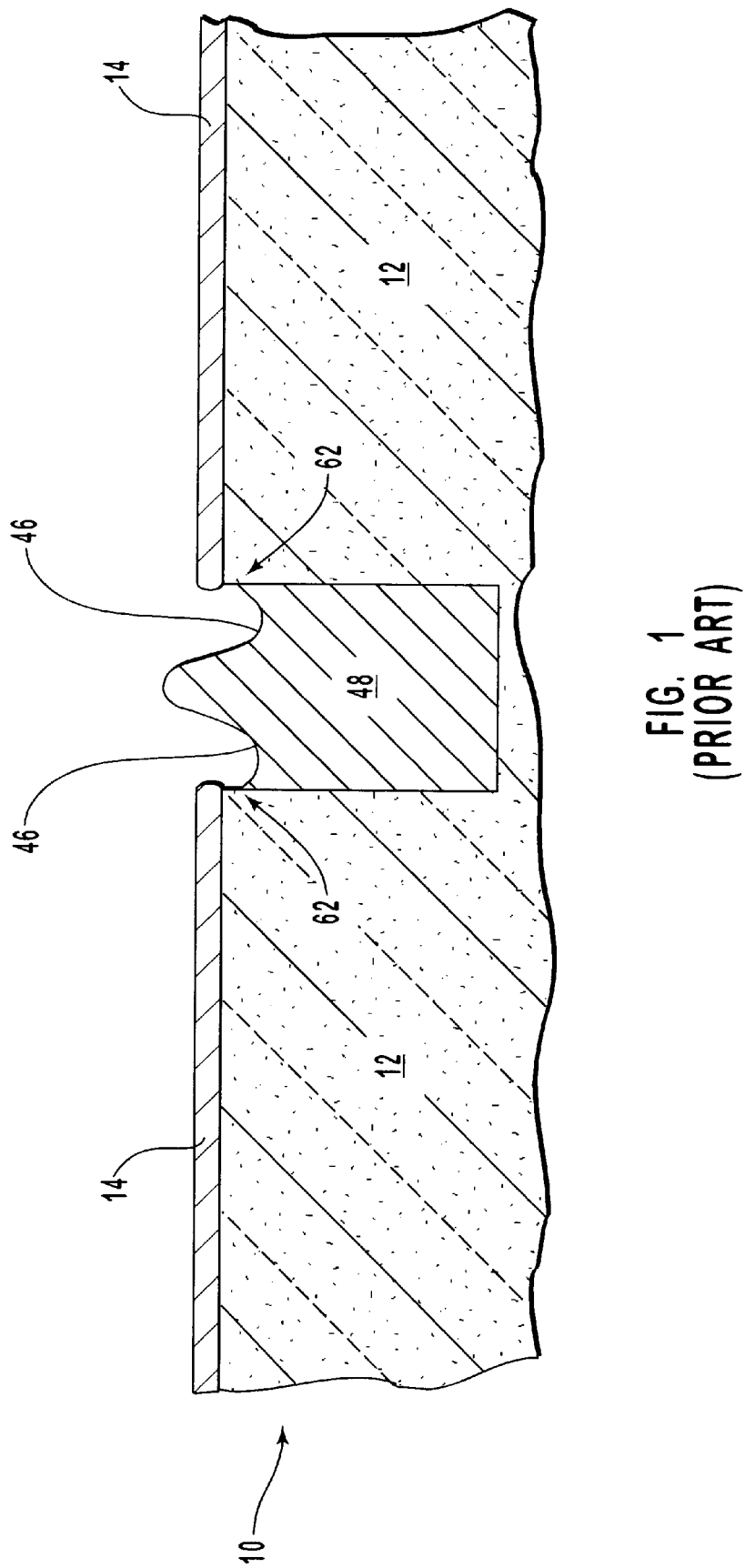
FIG. 1 illustrates the prior art problem of an uneven etch of an isolation trench that results in exposing portions of an active area and unwanted thermal oxide encroachment into the active area.
Figure 2A:
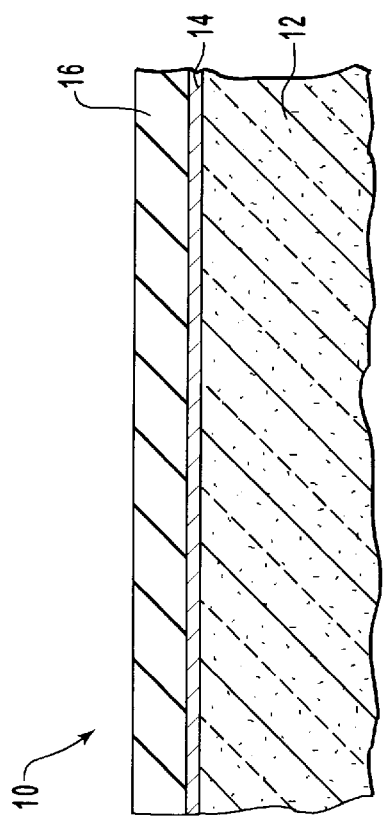
FIG. 2A is an elevational cross-section view of a semiconductor substrate, wherein a pad oxide and a nitride layer have been deposited upon the semiconductor substrate.

A starting structure for an example of a first embodiment of the present invention is illustrated in FIG. 2A. In FIG. 2A, a pad oxide 14 is grown upon a semiconductor substrate 12 on a semiconductor structure 10. Semiconductor substrate 12 can be substantially composed of silicon. Following growth of pad oxide 14, a nitride layer 16 is deposited over semiconductor substrate 12. FIG. 2A illustrates deposition of nitride layer 16 upon pad oxide 14.

Figure 4A:
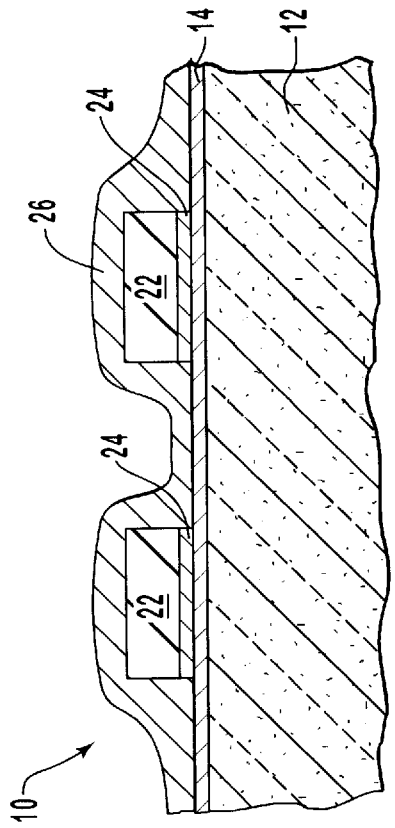
FIG. 4A is a view of further processing of FIG. 3A, wherein the mask has been removed and an insulation film has been deposited over the nitride island.

FIG. 3A illustrates a step in the formation of an isolation trench by the method of the present invention. Nitride layer 16 is patterned with a mask 20. An anisotropic etch selectively removes portions of nitride layer 16. FIG. 3A illustrates the result of etching with the use of mask 20, wherein nitride layer 16 has formed an insulator island 22, as seen in FIG. 4A. Insulator island 22 is patterned over and protects future or current active areas (not pictured) in semiconductor substrate 12 during isolation trench processing. Following etch of nitride layer 16, mask 20 is removed.

FIG. 4A illustrates further processing of the structure depicted in FIG. 3A, wherein an insulation film 26 has been deposited upon insulator island 22 and exposed portions of pad oxide 14. Insulation film 26 can be an oxide such as silicon dioxide, and can be formed for example by decomposition of tetraethyl ortho silicate (TEOS). Insulation film 26 may also be formed by a plasma enhanced chemical vapor deposition (PECVD) process so as to deposit a nitride layer such as $Si_3N_4$ or equivalent. When insulation film 26 is a nitride layer, insulator island 22 would be selected to be composed of a substantially different material, such as an oxide. Formation of substantially different materials between insulator island 22 and insulation film 26 facilitate selective etchback or selective mechanical planarization such as chemical-mechanical polishing (CMP) in the inventive method of forming an isolation trench.

Following deposition of insulation film 26, a spacer etch and an isolation trench etch are carried out. The spacer etch and the isolation trench etch can be carried out with a single etch recipe that is selective to insulation film 26. Alternatively, the spacer etch and the isolation trench etch can be carried out with two etch recipes. As such, the first etch etches insulation film 26 in a spacer etch that forms a spacer 28 seen in FIG. 5A. The second etch, or isolation trench etch, has an etch recipe that is selective to spacer 28 and insulator island 22, and anisotropically etches an isolation trench 32 having a side wall 50 in semiconductor substrate 12.

Spacer 28 may facet during the spacer etch such that a substantially linear spacer profile is achieved. Spacer 28 adds the advantage to the inventive process of extending the lateral dimension of the active area that is to be formed within semiconductor substrate 12 immediately beneath insulator island 22. Because spacer 28 takes up lateral space that would otherwise be available for isolation trench 32, isolation trench 32 is made narrower and the active area that is to be formed within semiconductor substrate 12 is made wider.

Following the formation of isolation trench 32, sidewall 50 of isolation trench 32 has optionally formed thereon an insulation liner 30. For example, thermal oxidation of sidewall 50 will form insulation liner 30 within isolation trench 32. Insulation liner 30 will preferably be substantially composed of silicon dioxide. In FIG. 5A it can be seen that, following thermal oxidation of sidewall 50 to form insulation liner 30 within isolation trench 32, semiconductor substrate 12 forms a rounded edge at the top of isolation trench 32. Rounding of the top of semiconductor substrate 12 at the corners of isolation trench 32 provides an added advantage of further isolating semiconductor substrate 12 immediately beneath insulator island 22; thereby an active area that will form in semiconductor substrate 12 immediately under insulator island 22 will be further isolated. The feature of rounding of the corners of semiconductor substrate 12 at the tops of isolation trenches 32 as depicted in FIGS. 5A and 5B is presupposed in all embodiments of the present invention as a preferred alternative.

Another method of forming insulation liner 30 is CVD of a dielectric material, or a dielectric material precursor that deposits preferentially upon sidewall 50 of isolation trench 32. The material of which insulation liner 30 is substantially composed may be particularly resistant to further etching, cleaning, or other processing conditions.

Insulation liner 30 may be substantially composed of a nitride such as $Si_3N_4$, or an equivalent, and can be selectively formed upon sidewall 50 of isolation trench 32. When semiconductor substrate 12 immediately adjacent to isolation trench 32 is a doped monocrystalline silicon that forms, for example, an active area for a transistor source/drain region, oxidation is avoided therein by insulation liner 30. Insulation liner is preferably substantially composed of $Si_3N_4$ or a non-stoichiometric variant which seals sidewall 50 so as to prevent encroachment of oxide into semiconductor substrate 12.

Following formation of insulation liner 30, ion implantation is optionally carried out to form a doped trench bottom 34 at the bottom of isolation trench 32. For example, if semiconductor wafer 10 comprises an N-doped silicon substrate, implantation of P-doping materials at the bottom of isolation trench 32 will form a P-doped trench bottom 34. Ion implantation may be carried out in a field implantation mode. If a complementary metal oxide semiconductor (CMOS) is being fabricated, however, masking of complimentary regions of semiconductor substrate 12 is required in order to achieve the differential doping thereof. For an N-doped silicon substrate, a high breakdown voltage may be achieved by P-doping. A low breakdown voltage may achieved by N-doping, and an intermediate breakdown voltage may be achieved by no doping. Because the present invention relates to formation of isolation trenches, P-doping in an N-well region, or N-doping in a P-well region are preferred.

Preferably, implantation of P-doping ions is carried out to form doped trench bottom 34 in a direction that is substantially orthogonal to the plane of pad oxide 14. Slightly angled implantation of P-implantation ions may be carried out to enrich or broaden the occurrence of P-doping ions in doped trench bottom 34 at the bottom of isolation trench 32. If P-doping is carried out where semiconductor substrate 12 is N-doped, care must be taken not to dope through insulation liner 30 on sidewall 50 near pad oxide 14, which may cause detrimental deactivation of active areas (not shown) in semiconductor substrate 12.

Following optional implantation of doping ions, it may be desirable, depending upon the intended shape and design of the isolation trench, to remove all or a portion of spacer 28. The isolation trench formed by the inventive method, however, will preferably include at least a portion of spacer 28 that extends away from the isolation trench 32.

As seen in FIG. 6A, isolation trench 32 is filled by an isolation film 36 which also is formed upon insulator island 22. Isolation film 36 can be formed by a deposition process using, for example, TEOS as a precursor.

An optional processing step of the inventive method is to fuse together spacer 28, pad oxide 14, and isolation film 36. The processing technique for such fusion is preferably a heat treatment of semiconductor structure 10. If such fusion is contemplated, it is also desirable that spacer 28, pad oxide 14, and isolation film 36 all be composed of substantially the same material, as fusion is best facilitated with common materials.

It is preferable, at some point in fabrication of the isolation trench, to densify the fill material of the isolation trench. Densification is desirable because it helps to prevent separation of materials in contact with the fill material. As seen in FIG. 6A, densification will prevent isolation film 36 from separating at interfaces with spacer 28, pad oxide layer 14, and insulation liner 30. It is preferable to perform densification of isolation film 36 immediately following its deposition. Depending upon the specific application, however, densification may be carried out at other stages of the process. For example, densification of isolation film 36 by rapid thermal processing (RTP) may make either etchback or CMP more difficult. As such, it is preferable to densify later in the fabrication process, such as after planarizing or etchback processing.

FIG. 7A illustrates a subsequent step of formation of the isolation trench wherein insulator island 22, spacer 28, and isolation film 36 are planarized to a common co-planar first upper surface 38. First upper surface 38 will preferably be formed by a CMP or etchback process. Preferably, planarization will be selective to isolation film 36, and relatively slightly selective to insulator island 22, such as by a factor of about one half. A first preferred selectivity of an etch recipe used in the inventive method is in the range of about 1:1 to about 2:1, selective to isolation film 36 as compared to insulator island 22. A more preferred selectivity is in the range of about 1.3:1 to about 1.7:1. A most preferred selectivity is about 1.5:1. Planarization also requires the etch recipe to be slightly selective to spacer 28 over insulator island 22. Preferably spacer 28 and isolation film 36 are made from the same material such that the etch will be substantially uniform as to the selectivity thereof with respect to spacer 28 and isolation film 36 over insulator island 22.

First upper surface 38 is illustrated as being substantially planar in FIG. 7A. It will be appreciated by one of ordinary skill in the art that first upper surface 38 will form a nonplanar profile or topography depending upon the selectivity of the etch recipe or of the chemical used in a planarization technique such as CMP. For example, where reduced island 52 is formed from a nitride material and isolation film 36 is formed from an oxide material, first upper surface 38 would undulate as viewed in cross section with more prominent structures being the result of an etch or planarization technique more selective thereto.

In FIG. 7A, reduced island 52 has been formed from insulator island 22. Additionally, portions of isolation film 36 and spacer 28 remain after planarization. Reduced island 52 preferably acts as a partial etch stop.

FIG. 8A illustrates the results of removal of reduced island 52. Reduced island 52 is preferably removed with an etch that is selective to isolation film 36 and spacer 28, leaving an isolation structure 48 that extends into and above isolation trench 32, forming a nail shaped structure having a head 54 extending above and away from isolation trench 32 upon an oxide layer 44. The future or current active area of semiconductor substrate 12, which may be at least partially covered over by head 54, is substantially prevented from a detrimental charge and current leakage by head 54.

Phantom lines 60 in FIG. 8A illustrate remnants of pad oxide layer 14, insulation liner 30, and spacer 28 as they are optionally thermally fused with isolation film 36 to form isolation structure 48. Isolation structure 48, illustrated in FIG. 8A, comprises a trench portion and a flange portion which together, when viewed in cross section, form the shape of a nail.

The trench portion of isolation structure 48 is substantially composed of portions of isolation film 36 and insulation liner 30. The trench portion intersects the flange portion at a second upper surface 40 of semiconductor substrate 12 as seen in FIG. 8A. The trench portion also has two sidewalls 50. FIG. 8A shows that the trench portion is substantially parallel to a third upper surface 42 and sidewalls 50. The flange portion is integral with the trench portion and is substantially composed of portions of pad oxide layer 14, spacer 28, and isolation film 36. The flange portion has a lowest region at second upper surface 40 where the flange portion intersects the trench portion. The flange portion extends above second upper surface 40 to third upper surface 42 seen in FIG. 8A. Upper surfaces 40, 42 are substantially orthogonal to two flange sidewalls 64 and sidewall 50. The flange portion is substantially orthogonal in orientation to the trench portion. The flange portion may also include a gate oxide layer 44 after gate oxide layer 44 is grown.

Following formation of isolation structure 48, it is often useful to remove pad oxide 14, seen in FIG. 8A, due to contamination thereof during fabrication of isolation structure 48. Pad oxide 14 can become contaminated when it is used as an etch stop for removal of reduced island 52. For example, pad oxide 14 may be removed by using aqueous HF to expose second upper surface 40. A new oxide layer, gate oxide layer 44, may then be formed on second upper surface 40 having third upper surface 42.

Semiconductor structure 10 may be implanted with ions as illustrated by arrows seen in FIG. 8A. This implantation, done with N-doping materials in an N-well region, for example, is to enhance the electron conductivity of the active area (not shown) of semiconductor substrate 12. Either preceding or following removal of pad oxide 14 seen in FIG. 8A, an enhancement implantation into the active area of semiconductor substrate 12 may be carried out, whereby preferred doping ions are implanted on either side of isolation structure 48.

Ion implantation into semiconductor substrate 12 to form active areas, when carried out with isolation structure 48 in place, will cause an ion implantation concentration gradient to form in the region of semiconductor substrate 12 proximate to and including second upper surface 40. The gradient will form within semiconductor substrate 12 near second upper surface 40 and immediately beneath the flange sidewalls 64 as the flange portion of isolation structure 48 will partially shield semiconductor substrate 12 immediately therebeneath. Thus, an ion implant gradient will form and can be controlled in part by the portion of semiconductor substrate 12 that is covered by head 54.

Gate oxide layer 44 is formed upon second upper surface 40 after pad oxide 14 has been removed to form portions of third upper surface 42. The entirety of third upper surface 42 includes head 54 of isolation structure 48 as it extends above gate oxide layer 44 and gate oxide layer 44.

In a variation of the first embodiment of the present invention, the structure illustrated in FIG. 6A is planarized by use of a single etchback process. The single etchback uses an etch recipe that has a different selectivity for insulator island 22 than for isolation film 36. In this alternative embodiment, spacer 28, dielectric film 36, and pad oxide 14 are composed of substantially the same material. Insulator island 22 has a composition different from that of isolation film 36. For example, isolation film 36 and spacer 28 are composed of $SiO_2$, and insulator island 22 is composed of silicon nitride.

The etch recipe for the single etchback is chosen to be selective to isolation film 36 such that, as upper surface 58 of isolation film 36 recedes toward pad oxide 14 and eventually exposes insulator island 22 and spacer 28, insulator island 22 has a greater material removal rate than spacer 28 or isolation film 36. As such, a final isolation structure 48 illustrated in FIG. 9A is achieved. Pad oxide 14 acts as an etch stop for this etch recipe. A residual depression of isolation film 36 may appear centered over filled isolation trench 32. A depression would be created, centered above isolation trench 32, during the filling of isolation trench 32 with isolation film 36, as seen in FIG. 6A. Where a depression is not detrimental to the final isolation structure 48 as illustrated in FIG. 9A, this selective etch recipe alternative may be used.

Semiconductor structure, 10 as illustrated in FIG. 9A, can be seen to have a substantially continuous isolation structure substantially covering semiconductor substrate 12. An upper surface 42a of isolation structure 48 includes the head portion or nail head 54. Semiconductor substrate 12 is covered at an upper surface 42b by either a pad oxide layer or a gate oxide layer. Another upper surface 42c comprises the upper surface of the pad oxide layer or gate oxide layer.

Figure 2B:
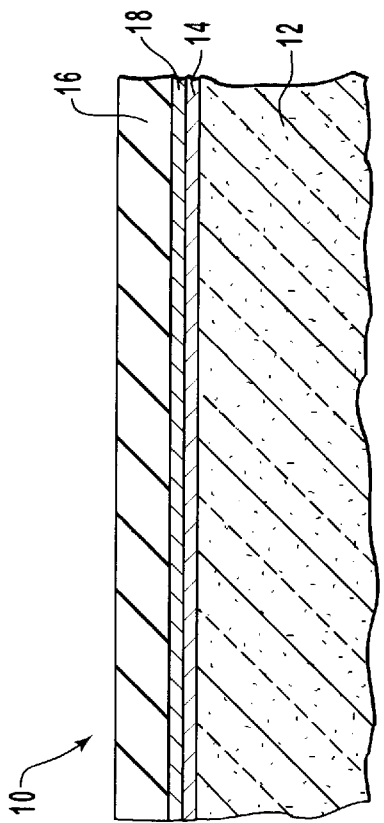
FIG. 2B is an elevational cross-section view of a semiconductor substrate having thereon a polysilicon layer that has been deposited upon a pad oxide, and a nitride layer that has been deposited upon the polysilicon layer.

A starting structure for an example of a second embodiment of the present invention is illustrated in FIG. 2B. In FIG. 2B, pad oxide layer 14 is grown upon semiconductor substrate 12 and a polysilicon layer 18 is deposited upon pad oxide layer 14. This embodiment of the present invention parallels the processing steps of the first embodiment with the additional processing that takes into account the use of polysilicon layer 18.

FIG. 3B illustrates etching through nitride layer 16 and polysilicon layer 18 to stop on pad oxide layer 14. The etch creates both an insulator island 22 and a polysilicon island 24 formed, respectively, from nitride layer 16 and polysilicon layer 18.

Figure 4B:
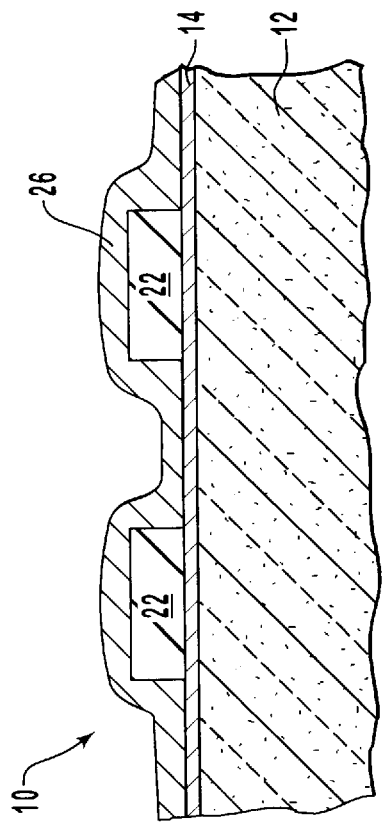
FIG. 4B illustrates further processing of the structure in FIG. 3B, wherein the mask has been removed and an insulation film has been deposited over the nitride island and the polysilicon island.

FIG. 4B illustrates further processing of the structure depicted in FIG. 3B, wherein insulation film 26 has been deposited upon insulator island 22, laterally exposed portions of polysilicon island 24, and exposed portions of pad oxide layer 14. Following deposition of insulation film 26, a spacer etch and an isolation trench etch are carried out similarly to the spacer etch and isolation trench etch carried out upon semiconductor structure 10 illustrated in FIG. 5A.

FIG. 5B illustrates the results of both the spacer etch and the isolation trench etch and optional implantation of isolation trench 32 to form doped well 34 analogous to doped trench bottom 34 illustrated in FIG. 5A. Formation of insulation liner 30 within isolation trench 32 preferentially precedes implantation to form doped trench bottom 34. Following optional implantation of doping ions, full or partial removal of spacer 28 may optionally be performed as set forth above with respect to the first embodiment of the invention.

FIG. 6B illustrates a subsequent step in fabrication of an isolation trench according to the second embodiment of the inventive method, wherein isolation film 36 is deposited both within isolation trench 32, and over both of insulator island 22 and spacer 28. As set forth above, densification of isolation film 36 is a preferred step to be carried out either at this stage of fabrication or at a subsequent selective stage. Planarization or etchback of isolation film 36 is next carried out as set forth in the first embodiment of the present invention, and as illustrated in FIG. 7B.

The process of planarization or etchback of isolation film 36 reduces insulator island 22 to form reduced island 52 as illustrated in FIG. 7B. Next, additional selective ion implantations can be made through polysilicon island 24 and into the active area of semiconductor substrate 12 that lies beneath polysilicon island 24.

In FIG. 8B, it can be seen in phantom that spacer 28 has a top surface that is co-planar with third upper surface 42 of isolation structure 48 after planarization. Polysilicon island 24 and spacer 28 are formed as shown in FIG. 8B. Removal of spacer 28 from the structures illustrated in FIG. 8B can be accomplished by patterning and etching with a mask that covers head 54 that extends above and away from isolation trench 32 seen in FIG. 8B. The etching process exposes a surface on semiconductor substrate 12 upon which a gate oxide layer is deposited or grown.

To form the structure seen in FIG. 9B, semiconductor structures 10 of FIGS. 7B or 8B are subjected to implantation of semiconductor substrate 12 with ions. Semiconductor structure 10 is then subjected to a heat treatment so as to fuse together isolation film 36, optional pad oxide layer 14, insulation liner 60, and spacer 28 into an integral filled isolation trench.

Subsequent to the process illustrated in FIGS. 6A–8A and 6B–9B a final thermal treatment, or subsequent thermal treatments, can be performed. Heat treatment may cause isolation structure 48 to be wider proximal to upper surface 42 than proximal to doped trench bottom 34. When so shaped, an unoxidized portion of the active area of semiconductor substrate 12 that forms sidewall 50 would have a trapezoidal shape when viewed in cross section, where the widest portion is upper surface 40 and the narrowest portion is at doped trench bottom 34. Where a trapezoidal shape of the trench portion causes unwanted encroachment into the active area of semiconductor substrate 12, the optional formation of insulation liner 30 from a nitride material or equivalent is used to act as an oxidation barrier for sidewall 50. Semiconductor structure 10 is illustrated in FIG. 9B as being implanted by doping ions, as depicted with downwardly-directed arrows. Following a preferred implantation, thermal processing may be carried out in order to achieve dopant diffusion near upper surface 42b of implanted ions residing within semiconductor substrate 12. Due to head 54 extending onto semiconductor substrate 12, a doping concentration gradient can be seen between the active area 53a and the active area 53b. The starting and stopping point of the doping concentration gradient in relation to flange sidewalls 64 will depend upon the duration and temperature of a thermal treatment.

The present invention may be carried out wherein spacer 28 and isolation film 36 are substantially composed of the same oxide material, and insulator island 22 is substantially composes of a nitride composition. Other compositions may be chosen wherein etch selectivity or CMP selectivity slightly favors insulator island 22 over both spacer 28 and isolation film 36. The specific selection of materials will depend upon the application during fabrication of the desired isolation trench.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. An isolation trench structure comprising:
   a semiconductor substrate having a top surface with an oxide layer thereon;
   a polysilicon layer upon said oxide layer;
   a first layer upon said polysilicon layer;
   a plurality of isolation trenches having electrically insulative material extending continuously between and within said plurality of isolation trenches, each said isolation trench:
      having a spacer substantially composed of a dielectric material upon said oxide layer in contact with said first layer and said polysilicon layer;
      extending from an opening thereto at the top surface of said semiconductor substrate and below said oxide layer into and terminating within said semiconductor substrate adjacent to and below said spacer;
      having a second layer filling said isolation trench and extending above said oxide layer in contact with said spacer; and
      having an upper surface formed from said second layer and said spacer and being situated above said oxide layer.

2. An isolation trench structure as defined in claim 1, wherein:
   said first layer is substantially composed of a dielectric material; and
   said second layer is substantially composed of a dielectric material.

3. An isolation trench structure as defined in claim 1, further comprising:
   a liner upon a sidewall of said isolation trench that extends from an interface thereof with said oxide layer to the termination of said isolation trench within said semiconductor substrate.

4. An isolation trench structure as defined in claim 3, wherein:
   said liner is substantially composed of a dielectric material; and
   said second layer is substantially composed of an electrically conductive material.

5. An isolation trench structure as defined in claim 1, further comprising:
   a doped region below the termination of said isolation trench within said semiconductor substrate.

6. An isolation trench structure comprising:
   a semiconductor substrate having a top surface with an oxide layer thereon;
   a first layer upon said oxide layer;
   a plurality of isolation trenches having electrically insulative material extending continuously between and within said plurality of isolation trenches, each said isolation trench:
      having a spacer substantially composed of a dielectric material upon said oxide layer in contact with said first layer;
      extending from an opening thereto at the top surface of said semiconductor substrate and below said oxide layer into and terminating within said semiconductor substrate adjacent to and below said spacer;
      having a second layer filling said isolation trench and extending above said oxide layer in contact with said spacer; and
      having an upper surface formed from said second layer and said spacer and being situated above said oxide layer.

7. An isolation trench structure as defined in claim 6, wherein:
   said first layer is substantially composed of a dielectric material; and
   said second layer is substantially composed of a dielectric material.

8. An isolation trench structure as defined in claim 6, further comprising:
   a liner upon a sidewall of said isolation trench that extends from an interface thereof with said oxide layer to the termination of said isolation trench within said semiconductor substrate.

9. An isolation trench structure as defined in claim 8, wherein:
   said liner is substantially composed of a dielectric material; and
   said second layer is substantially composed of an electrically conductive material.

10. An isolation trench structure as defined in claim 6, further comprising:
    an electrically active region below the termination of said isolation trench within said semiconductor substrate.

11. An isolation trench structure as defined in claim 1, wherein the semiconductor substrate is doped with a dopant having a first conductivity type, the isolation trench structure further comprising a doped trench bottom within the semiconductor substrate below and in contact with a respective one of each said isolation trench, the doped trench bottom being doped with a dopant having a second conductivity type opposite the first conductivity type.

12. An isolation trench structure as defined in claim 11, wherein the doped trench bottom has a width, each said isolation trench has a width, and the width of each said doped trench bottom is greater than the width of the respective isolation trench.

13. An isolation trench structure as defined in claim 6, wherein the semiconductor substrate is doped with a dopant having a first conductivity type, the isolation trench structure further comprising a doped trench bottom within the semiconductor substrate below and in contact with each said isolation trench, the doped trench bottom being doped with a dopant having a second conductivity type opposite the first conductivity type.

14. An isolation trench structure as defined in claim 13, wherein each said doped trench bottom has a width, each said isolation trench as a width, and the width of each said doped trench bottom is greater than the respective width of the isolation trench.

15. An isolation trench structure as defined in claim 3, wherein the liner terminates at a rounded edge at the interface thereof with said oxide layer.

16. An isolation trench structure comprising:
    a semiconductor substrate having a top surface with an oxide layer thereon;
    a polysilicon layer upon said oxide layer;
    a first layer upon said polysilicon layer;
    a plurality of isolation trenches having electrically insulative material extending continuously between and within said plurality of isolation trenches, each said isolation trench:
       having a side wall and extending from an opening thereto at the top surface of said semiconductor substrate and below said oxide layer into and terminating within said semiconductor substrate adjacent to and below said first layer;

a second layer of dielectric material filling said isolation trench, extending above said oxide layer in contact with said first layer, and extending above and perpendicular to the side wall of said isolation trench, wherein said isolation trench is filled with electrically insulative material to the exclusion of electrically conductive material; and a planarized upper surface formed from said second layer and said first layer and being situated above said oxide layer.

17. An isolation trench structure comprising:

a semiconductor substrate having a top surface with an oxide layer thereon;

a first layer upon said oxide layer;

a plurality of isolation trenches having electrically insulative material extending continuously between and within said plurality of isolation trenches, each said isolation trench:

having a side wall and extending from an opening thereto at the top surface of said semiconductor substrate and below said oxide layer into and terminating within said semiconductor substrate adjacent to and below said first layer;

a second layer filling said isolation trench and extending above said oxide layer in contact with said first layer, and extending above and perpendicular to the side wall of said isolation trench, wherein said isolation trench is filled with electrically insulative material to the exclusion of electrically conductive material; and a planarized upper surface formed from said second layer and said first layer and being situated above said oxide layer.

18. An electrical structure comprising:

a semiconductor substrate having a top surface with an oxide layer thereon;

a polysilicon layer upon said oxide layer;

a first layer upon said polysilicon layer;

a first isolation area including:

a first spacer substantially composed of a dielectric material upon said oxide layer in contact with said first layer and said polysilicon layer;

a first isolation trench extending from an opening thereto at the top surface of said semiconductor substrate and below said oxide layer into and terminating within said semiconductor substrate adjacent to and below said first spacer, wherein said first spacer is situated on a side of said first isolation trench;

a second spacer substantially composed of a dielectric material upon said oxide layer in contact with said first layer and said polysilicon layer, said second spacer being situated on a side of said first isolation trench opposite the side of said first spacer;

a second isolation area including:

a first spacer substantially composed of a dielectric material upon said oxide layer in contact with said first layer and said polysilicon layer;

a first isolation trench extending below said oxide layer into and terminating within said semiconductor substrate adjacent to and below said first spacer of said second isolation area, wherein said first spacer of said second isolation area is situated on a side of said first isolation trench;

a second spacer substantially composed of a dielectric material upon said oxide layer in contact with said first layer and said polysilicon layer, said second spacer of said second isolation area being situated on a side of said first isolation trench opposite the side of said first spacer of said second isolation area;

an active area located within said semiconductor substrate between said first and second isolation areas;

a second layer, composed of an electrically insulative material, filling said first and second isolation trenches and extending continuously therebetween and above said oxide layer in contact with said first and second spacers of said respective first and second isolation areas; and an upper surface formed from said second layer and said first and second spacers of said respective first and second isolation areas, and being situated above said oxide layer.

19. An isolation trench structure comprising:

a semiconductor substrate having a top surface with an oxide layer thereon;

a first layer upon said oxide layer;

a first isolation area including:

a first spacer substantially composed of a dielectric material upon said oxide layer in contact with said first layer;

a first isolation trench extending from an opening thereto at the top surface of said semiconductor substrate and below said oxide layer into and terminating within said semiconductor substrate adjacent to and below said first spacer, wherein said first spacer is situated on a side of said first isolation trench;

a second spacer substantially composed of a dielectric material upon said oxide layer in contact with said first layer, said second spacer being situated on a side of said first isolation trench opposite the side of said first spacer;

a second isolation area including:

a first spacer substantially composed of a dielectric material upon said oxide layer in contact with said first layer;

a first isolation trench extending below said oxide layer into and terminating within said semiconductor substrate adjacent to and below said first spacer of said second isolation area, wherein said first spacer of said second isolation area is situated on a side of said first isolation trench;

a second spacer substantially composed of a dielectric material upon said oxide layer in contact with said first layer, said second spacer of said second isolation area being situated on a side of said first isolation trench opposite the side of said first spacer of said second isolation area;

an active area located within said semiconductor substrate between said first and second isolation areas;

a second layer, composed of an electrically insulative material, filling said first and second isolation trenches and extending continuously therebetween and above said oxide layer in contact with said first and second spacers of said respective first and second isolation areas; and an upper surface formed from said second layer and said first and second spacers of said respective first and second isolation areas, and being situated above said oxide layer.

20. An electrical structure comprising:

a semiconductor substrate having a top surface and being doped with a dopant having a first conductivity type;

a plurality of isolation trenches having electrically insulative material extending continuously between and within said plurality of isolation trenches, each said isolation trench:
  extending from an opening thereto at the top surface of the semiconductor substrate and terminating within said semiconductor substrate;
  having a doped trench bottom within the semiconductor substrate below and in contact with the isolation trench, the doped trench bottom being doped with a dopant having a second conductivity type opposite the first conductivity type;
  having a dielectric material filling said isolation trench, having a planarized upper surface and extending above said top surface of said semiconductor substrate, and extending away from said isolation trench upon the top surface of said semiconductor substrate, wherein said isolation trench is filled with electrically insulative material to the exclusion of electrically conductive material.

21. The electrical structure as defined in claim 20, wherein the dielectric material has a planar upper surface.

22. The electrical structure as defined in claim 20, further comprising an active area within the semiconductor substrate in contact with the isolation trench.

23. An electrical structure comprising:
  a semiconductor substrate having a top surface and being doped with a dopant having a first conductivity type;
  a first isolation area including:
    an isolation trench extending from an opening thereto at the top surface of the semiconductor substrate and terminating within said semiconductor substrate;
    a doped trench bottom within the semiconductor substrate below and in contact with the isolation trench of the first isolation area, the doped trench bottom being doped with a dopant having a second conductivity type opposite the first conductivity type;
    a dielectric material filling said isolation trench of the first isolation area to the exclusion of electrically conductive material, having a planarized upper surface and extending above said top surface of said semiconductor substrate, and extending away from said isolation trench of the first isolation area upon the top surface of said semiconductor substrate;
  a second isolation area including:
    an isolation trench extending below the top surface of the semiconductor substrate and terminating within said semiconductor substrate;
    a doped trench bottom within the semiconductor substrate below and in contact with the isolation trench of the second isolation area, the doped trench bottom being doped with a dopant having a second conductivity type opposite the first conductivity type;
    a dielectric material filling said isolation trench of the second isolation area to the exclusion of electrically conductive material, having a planarized upper surface and extending above said top surface of said semiconductor substrate, and extending away from said isolation trench upon the top surface of said semiconductor substrate;
    an active area located within said semiconductor substrate between said first and second isolation areas, and wherein electrically insulative material extends continuously between and within said first and second isolation trenches of said respective first and second isolation areas.

24. The electrical structure as defined in claim 23, wherein the active area is in contact with the respective isolation trenches of the first and second isolation areas.

25. An isolation trench structure comprising:
  a semiconductor substrate having an oxide layer thereon;
  an electrically conductive material upon said oxide layer;
  a first layer upon said electrically conductive material;
  a plurality of isolation trenches having electrically insulative material extending continuously between and within said plurality of isolation trenches, each said isolation trench:
    having a pair of spacers having a minimum width therebetween and being substantially composed of a dielectric material and situated upon said oxide layer in contact with said first layer and said electrically conductive material;
    extending below said oxide layer into and terminating within said semiconductor substrate adjacent to and below said pair of spacers, said isolation trench having a width not greater than the minimum width between the pair of spacers;
    having a second layer filling said isolation trench and extending above said oxide layer in contact with said spacer; and
    having an upper surface formed from said second layer and said pair of spacers and being situated above said oxide layer.

26. The isolation trench structure as defined in claim 25, wherein the upper surface formed from said second layer and said pair of spacers is planarized.

27. An isolation trench structure comprising:
  a semiconductor substrate having an oxide layer thereon;
  a first layer upon said oxide layer;
  a plurality of isolation trenches having electrically insulative material extending continuously between and within said plurality of isolation trenches, each said isolation trench:
    having a pair of spacers having a minimum width therebetween and being composed of a dielectric material and situated upon said oxide layer in contact with said first layer;
    extending below said oxide layer into and terminating within said semiconductor substrate adjacent to and below said pair of spacers, said isolation trench having a width not greater than the minimum width between the pair of spacers;
    a second layer filling said isolation trench and extending above said oxide layer in contact with said spacer; and
    an upper surface formed from said second layer and said pair of spacers and being situated above said oxide layer.

28. The isolation trench structure as defined in claim 27, wherein the upper surface formed from said second layer and said pair of spacers is planarized.

29. An isolation trench structure comprising:
  a semiconductor substrate having a top surface with an oxide layer thereon;
  a polysilicon layer upon said oxide layer;
  a first layer upon said polysilicon layer;
  a plurality of isolation trenches having electrically insulative material extending continuously between and within said plurality of isolation trenches, each said isolation trench:
    having side walls and a width therebetween, the isolation trench extending between a pair of spacers at an opening thereto at the top surface of said semiconductor substrate and below said oxide layer, the isolation trench further extending into and terminating within said semiconductor substrate adjacent to and below said first layer, said pair of spacers having a minimum width therebetween that is not less than the width between said side walls;

having a second layer of dielectric material filling said isolation trench, extending above said oxide layer in contact with said first layer, and extending above and perpendicular to the side walls of said isolation trench; and having a upper surface formed from said second layer and said first layer and being situated above said oxide layer.

30. The isolation trench structure as defined in claim 29, wherein the upper surface formed from said second layer and said spacer is planarized.

31. An isolation trench structure comprising:

a semiconductor substrate having a top surface with an oxide layer thereon;

a first layer upon said oxide layer;

a plurality of isolation trenches, wherein electrically insulative material extends continuously between and within each said isolation trench, each said isolation trench having:

a pair of side walls with a width therebetween, the isolation trench extending between a pair of spacers and having from an opening thereto at the top surface of said semiconductor substrate and below said oxide layer, the isolation trench further extending into and terminating within said semiconductor substrate adjacent to and below said first layer, said pair of spacers having a minimum width therebetween that is not less than the width between said side walls;

a second layer filling said isolation trench and extending above said oxide layer in contact with said first layer, and extending above and perpendicular to the side wall of said isolation trench; and an upper surface formed from said second layer and said first layer and being situated above said oxide layer.

32. The isolation trench structure as defined in claim 31, wherein the upper surface formed from said second layer and said spacer is planarized.

33. An electrical structure comprising:

a semiconductor substrate having a top surface and being doped with a dopant having a first conductivity type;

a plurality of isolation trenches, wherein electrically insulative material extends continuously between and within each said isolation trench, each said isolation trench having:

a width and extending between a pair of spacers, an opening thereto at the top surface of the semiconductor substrate and terminating within said semiconductor substrate, the pair of spacers having a minimum width therebetween, the width of said isolation trench being not greater than the minimum width between said pair of spacers;

a doped trench bottom within the semiconductor substrate below and in contact with the isolation trench, the doped trench bottom being doped with a dopant having a second conductivity type opposite the first conductivity type;

a dielectric material filling said isolation trench, having an upper surface and extending above said top surface of said semiconductor substrate, and extending away from said isolation trench upon the top surface of said semiconductor substrate.

34. The isolation trench structure as defined in claim 33, wherein the upper surface formed from said second layer and said spacer is planarized.

35. The isolation trench structure as defined in claim 1, wherein the upper surface formed from said second layer and said spacer is planarized.

36. The isolation trench structure as defined in claim 6, wherein the upper surface formed from said second layer and said spacer is planarized.

37. The isolation trench structure as defined in claim 18, wherein the upper surface formed from said second layer and said first and second spacers of said respective first and second isolation areas is planarized.

38. The isolation trench structure as defined in claim 19, wherein the upper surface formed from said second layer and said first and second spacers of said respective first and second isolation areas is planarized.

39. The isolation trench structure as defined in claim 23, wherein the dielectric material filling said first isolation trench and the dielectric material filling the said second isolation trench are co-planar.

40. An electrical structure comprising:

a semiconductor substrate having a top surface;

first and second isolation trenches each:

extending into and being defined by the semiconductor substrate;

having an opening thereto at the top surface of the semiconductor substrate; and extending below and being centered between a pair of spacers situated above the top surface of the semiconductor substrate; and wherein:

an electrically insulative material extends continuously between and within the first and second isolation trenches; and a planar surface begins at the first isolation trench and extends continuously to the second isolation trench.

* * * * *